(12) United States Patent
Nothern, III et al.

(10) Patent No.: US 10,613,341 B2
(45) Date of Patent: Apr. 7, 2020

(54) METHOD AND APPARATUS FOR LASER BEAM COMBINING AND SPECKLE REDUCTION

(71) Applicant: Microvision, Inc., Redmond, WA (US)

(72) Inventors: Alga Lloyd Nothern, III, Seattle, WA (US); Matthieu Saracco, Redmond, WA (US); Roeland Collet, Olympia, WA (US); Thomas Byeman, Redmond, WA (US)

(73) Assignee: Microvision, Inc., Redmond, WA (US)

( * ) Notice: Subject to any disclaimer, the term of this patent is extended or adjusted under 35 U.S.C. 154(b) by 222 days.

(21) Appl. No.: 15/948,151

(22) Filed: Apr. 9, 2018

(65) Prior Publication Data
US 2019/0310489 A1 Oct. 10, 2019

(51) Int. Cl.
| | |
|---|---|
| G02B 26/08 | (2006.01) |
| G02B 27/48 | (2006.01) |
| G02B 27/10 | (2006.01) |
| G02B 27/14 | (2006.01) |
| G02B 26/10 | (2006.01) |
| H01S 5/40 | (2006.01) |
| H01S 5/00 | (2006.01) |
| G02B 27/28 | (2006.01) |
| A63F 13/213 | (2014.01) |
| G02B 27/01 | (2006.01) |
| G01S 17/10 | (2020.01) |

(52) U.S. Cl.
CPC ......... *G02B 27/48* (2013.01); *G02B 26/0833* (2013.01); *G02B 26/101* (2013.01); *G02B 26/105* (2013.01); *G02B 27/1006* (2013.01); *G02B 27/141* (2013.01); *G02B 27/283* (2013.01); *H01S 5/0071* (2013.01); *H01S 5/4012* (2013.01); *H01S 5/4075* (2013.01); *H01S 5/4093* (2013.01); *A63F 13/213* (2014.09); *G01S 17/10* (2013.01); *G02B 27/0172* (2013.01); *G02B 2027/0178* (2013.01)

(58) Field of Classification Search
CPC .. G02B 27/48; G02B 27/1006; G02B 27/141; G02B 26/105; G02B 26/0833; G02B 26/101; G02B 27/283; G02B 2027/0178; G02B 27/0172; G02B 27/286; G02B 27/01; G02B 27/017; G02B 26/085; H01S 5/4012; H01S 5/4093; H01S 5/0071; H01S 5/4075; A63F 13/213; G01S 17/10; G01S 7/4817
USPC ....................................... 359/200.8
See application file for complete search history.

(56) References Cited

U.S. PATENT DOCUMENTS

| | | | |
|---|---|---|---|
| 2012/0275002 A1* | 11/2012 | Nakao ................. | G02B 26/101 359/204.3 |
| 2013/0100456 A1* | 4/2013 | Yu ...................... | G01B 9/02014 356/479 |
| 2015/0249521 A1* | 9/2015 | Ono ..................... | G02B 27/283 398/65 |

* cited by examiner

*Primary Examiner* — Euncha P Cherry
(74) *Attorney, Agent, or Firm* — Kevin D. Wills

(57) ABSTRACT

A beam combining device combines laser beams and performs speckle reduction of the laser light. Two laser beams are incident on a non-polarizing beam splitter and combined beams are split into two light paths with different optical path lengths. The two light paths may have different geometric path lengths and/or different indices of refraction in the paths to produce the different optical path lengths. One of the light paths is passed through a polarization rotation device and then the two light paths are recombined with a polarizing beam splitter to produce a combined reduced speckle laser beam.

23 Claims, 15 Drawing Sheets

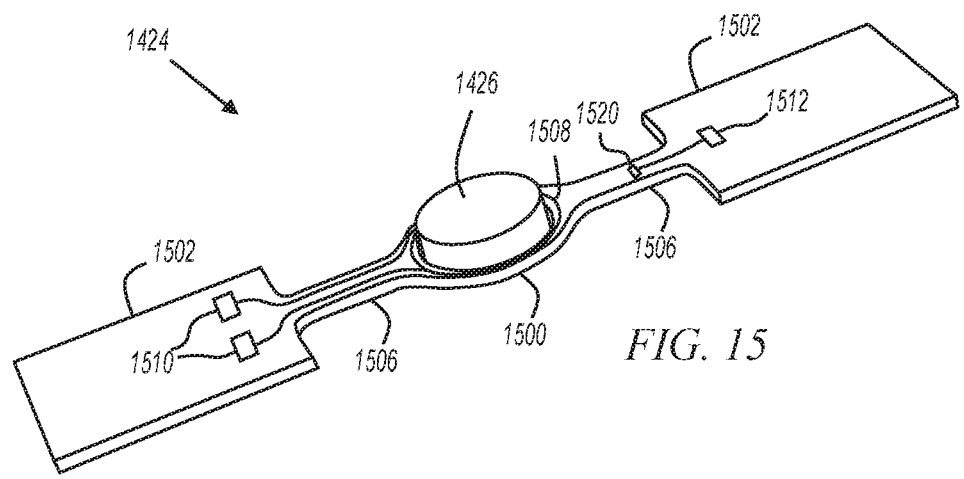
FIG. 15
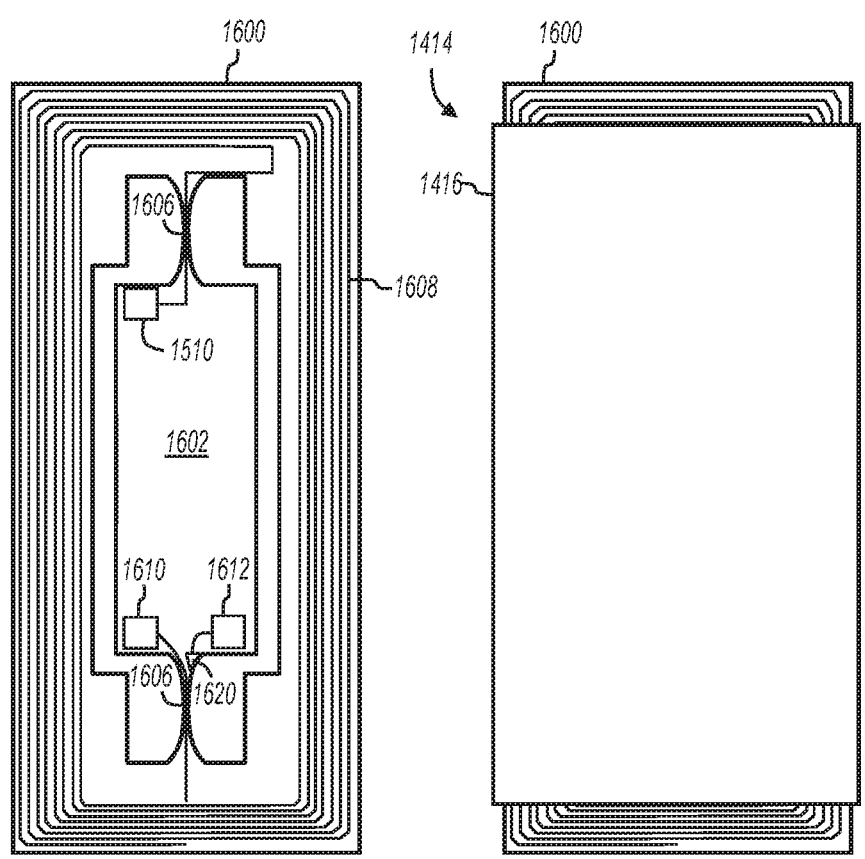
FIG. 16A
FIG. 16B

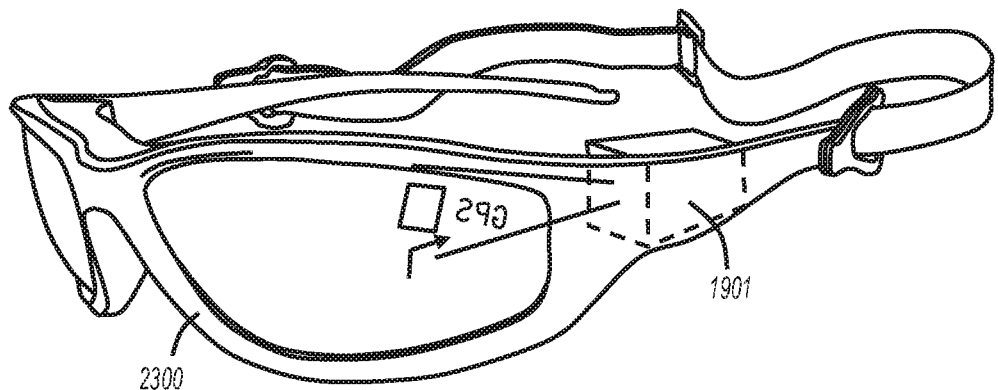
FIG. 23
FIG. 24
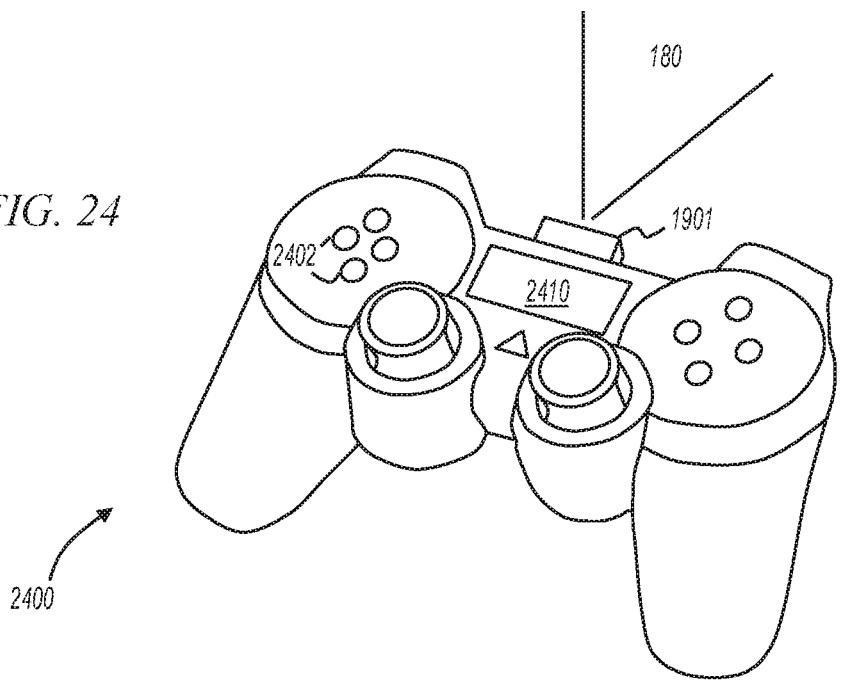

METHOD AND APPARATUS FOR LASER BEAM COMBINING AND SPECKLE REDUCTION

FIELD

The present invention relates generally to combining laser beams, and more specifically to combining laser beams and speckle reduction.

BACKGROUND

In scanning laser projectors, multiple laser beams (typically red, green, and blue) are combined to create an image. Laser light reflected off a surface sometimes exhibits a sparkling phenomenon referred to as "speckle." Laser light is spatially coherent, and when reflected off a diffuse surface, the reflected coherent light waves interfere with each other in a regular pattern that results in a user perceiving speckle. Scanning projectors that utilize lasers for light sources may exhibit speckle across a displayed image.

BRIEF DESCRIPTION OF THE DRAWINGS

FIG. 15 shows a perspective view of a MEMS device with a scanning mirror in accordance with various embodiments of the present invention;

FIGS. 16A and 16B show plan views of a MEMS device with a scanning mirror in accordance with various embodiments of the present invention;

FIG. 23 shows eyewear in accordance with various embodiments of the present invention; and FIG. 24 shows a gaming apparatus in accordance with various embodiments of the present invention.

DESCRIPTION OF EMBODIMENTS

Figure 1:
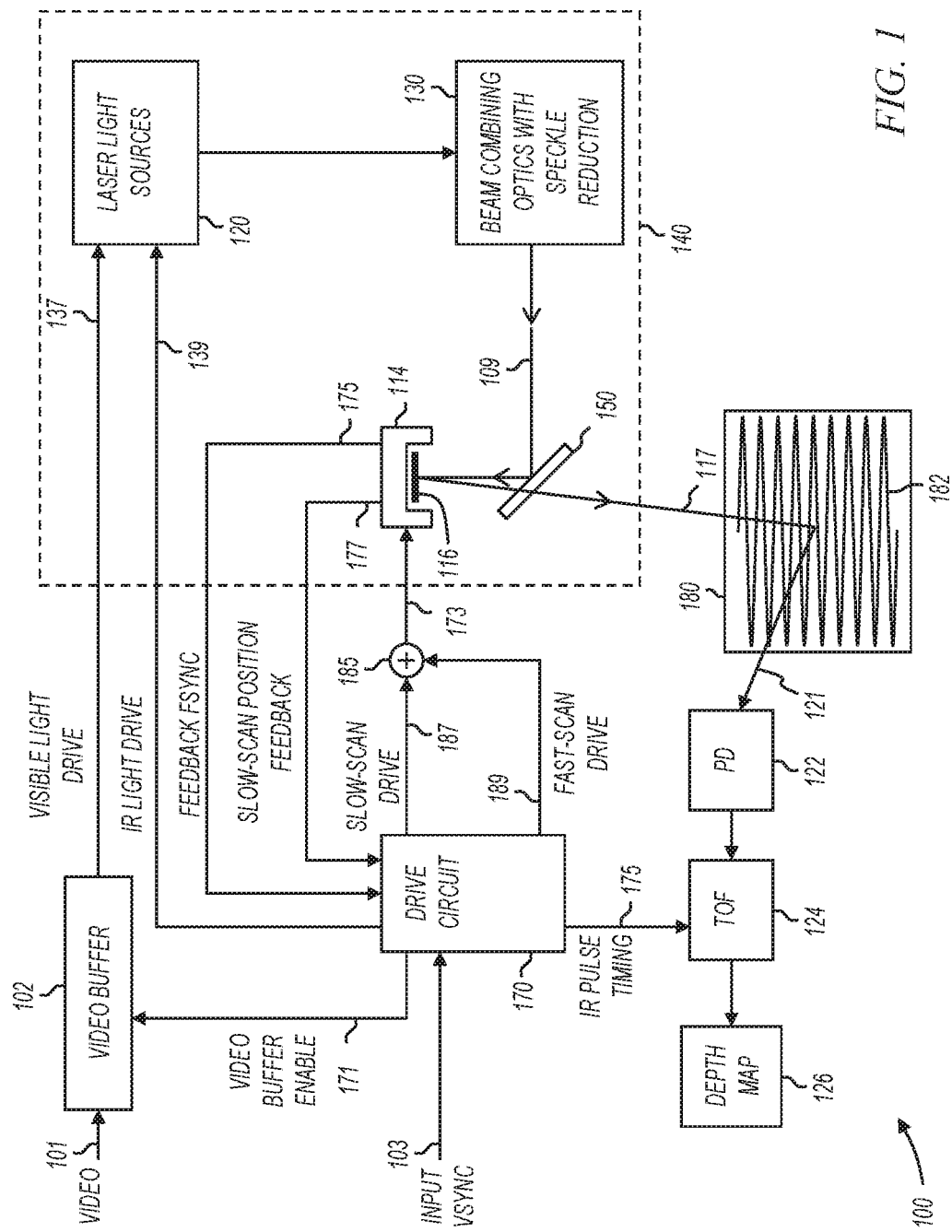
FIG. 1 shows a scanning laser projection system in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a scanning laser projection system in accordance with various embodiments of the present invention. Scanning laser projection system 100 includes video buffer 102, scanning engine 140, drive circuit 170, summer 185, photodetector 122, time-of-flight (TOF) measurement circuit 124, and depth map storage device 126.

In operation, video buffer 102 stores one or more rows of video content at 101 and provides drive values on node 137 to scanning engine 140 starting when commanded by drive circuit 170 through the video buffer enable signal 171. The commanded drive values correspond to electrical currents for visible light sources within laser light sources 120 (e.g., red, green, and blue laser diodes) such that the output intensity from the lasers is consistent with the input video content. In some embodiments, this process occurs at output pixel rates in excess of 150 MHz.

In some embodiments, the video data arrives row by row. For example, the first video data received may correspond to an upper left pixel in an image. Succeeding video data represents the remainder of the pixels in the top row from left to right, and then further rows from top to bottom. When the bottom right of the image is reached, then a complete "frame" of video data has been supplied. The rate at which frames of video data are received is referred to herein as the "frame rate." In typical applications, an input vertical sync (VSYNC) signal 103 is received with the video data and is asserted once per frame. Accordingly, the input VSYNC is periodic at the frame rate.

Scanning engine 140 includes laser light sources 120, beam combining optics with speckle reduction 130, fold mirror 150, and scanning device 114. Laser light sources 120 include at least two laser light sources that emit light of different wavelengths. For example, in some embodiments, laser light sources 120 include a first laser diode that emits red light and a second laser diode that emits green light. Also for example, in some embodiments, laser light sources 120 include a third laser diode that emits blue light. In still further embodiments, laser light sources 120 includes a fourth laser diode that emits infrared (IR) light. These and other embodiments are described further below. The terms "red," "green," and "blue" are used herein to refer to wavelengths that are perceived by a human eye as that particular color. For example, "red" refers to any wavelength of light that a human may perceive as the color red, "green" refers to any wavelength of light that a human may perceive as the color green, and "blue" refers to any wavelength of light that a human may perceive as the color blue.

Beam combining optics with speckle reduction 130 includes one or more optic devices that combine laser light received from laser light sources 120 while reducing speckle. Various embodiments of beam combining optics with speckle reduction 130 are described below with reference to later figures. Optics 130 produce a combined laser beam with reduced speckle at 109. This combined laser beam is reflected off fold mirror 150 and directed to scanning mirror 116 within scanning device 114.

In some embodiments, scanning mirror 116 is an ultra-high speed gimbal mounted two dimensional bi-axial laser scanning mirror. An example is described further with reference to FIG. 13. In some embodiments, this bi-axial scanning mirror is fabricated from silicon using MEMS processes. In some embodiments, as described below with reference to FIG. 14, two independent MEMS mirrors are employed in a combined optical system, each responsible for one of the scan axes. One axis of rotation is operated quasi-statically and creates a sawtooth raster trajectory. This axis is also referred to as the slow-scan axis. The second axis of rotation is orthogonal to the first and is operated on a resonant vibrational mode of the scanning mirror. In some embodiments, the MEMS device uses electromagnetic actuation, achieved using a miniature assembly containing the MEMS die and small subassemblies of permanent magnets and an electrical interface, although the various embodiments are not limited in this respect. For example, some embodiments employ electrostatic or piezoelectric actuation. Any type of mirror actuation may be employed without departing from the scope of the present invention. In some embodiments, the slow-scan axis corresponds to the vertical axis and the fast-scan axis corresponds to the horizontal axis, although this is not a limitation of the present invention. For example, a rotation of the projector may result in the fast-scan axis being the vertical axis and the slow-scan axis being the horizontal axis In some embodiments, raster scan 182 is formed by combining a sinusoidal component on the horizontal fast-scan axis and a sawtooth component on the vertical slow-scan axis. In these embodiments, output beam 317 sweeps horizontally (back and forth left-to-right) in a sinusoidal pattern, and sweeps vertically (top-to-bottom) in a sawtooth pattern with the display blanked during flyback (bottom-to-top). FIG. 1 shows the sinusoidal pattern as the beam sweeps vertically top-to-bottom, but does not show the flyback from bottom-to-top. In other embodiments, the vertical sweep is controlled with a triangular wave such that there is no flyback. In still further embodiments, the vertical sweep is sinusoidal or a non-symmetric scanning pattern. The various embodiments of the invention are not limited by the waveforms used to control the vertical and horizontal sweep or the resulting raster pattern.

A mirror drive circuit 170 provides a slow-scan drive signal on node 187 and a fast-scan drive signal on node 189. The fast-scan drive signal on node 189 includes an excitation signal to control the resonant angular motion of scanning mirror 116 on the fast-scan axis, and the slow-scan drive signal includes an excitation signal to cause deflection on the slow-scan axis. The slow-scan and fast-scan drive signals are combined by summer 185 to produce a drive signal used to drive MEMS device 114 on node 173. The resulting mirror deflection on both the fast and slow-scan axes causes output beam 117 to generate a raster scan 182 in field of view 180. In operation, the laser light sources produce light pulses for each output pixel and scanning mirror 116 reflects the light pulses as beam 117 traverses the raster pattern.

Mirror drive circuit 170 receives a feedback FSYNC signal from scanning device 114 on node 175, and also receives a slow-scan position feedback signal on node 177. The feedback FSYNC signal on node 175 provides information regarding the position of scanning mirror 116 on the fast-scan axis as it oscillates at a resonant frequency. In some embodiments, the feedback FSYNC signal describes the instantaneous angular position of the mirror, and in other embodiments, the feedback signal describes the maximum deflection angle of the mirror, also referred to herein as the amplitude of the feedback signal. The slow-scan position feedback signal on node 177 provides information regarding the position of scanning mirror 116 on the slow-scan axis. In some embodiments, the slow-scan position feedback signal is used to phase lock movement on the slow-scan axis to the period of the input VSYNC signal received on node 103. In these embodiments, the frequency of movement on the slow-scan axis is dictated by a received sync signal (in this case, the input VSYNC).

In some embodiments, scanning device 114 includes one or more analog-to-digital converters to digitize sensed position information. In these embodiments, either or both of the feedback FSYNC signal and the slow-scan position feedback signal are digital representations of the mirror position on the two axes. In other embodiments, the feedback signals are analog signals, and drive circuit 170 includes one or more analog-to-digital converters to digitize the feedback signals as appropriate.

In some embodiments, drive circuit 170 provides drive signals on node 139 to drive an infrared (IR) light source. For example, drive circuit 170 may provide an electrical current to drive an IR laser diode. In these embodiments, an IR laser diode within laser light sources 120 may emit IR light pulses at different points along raster scan 182 within field of view of 180 to perform distance measurements. For example, scanning laser projection device 100 may include laser detection and ranging (LIDAR) capabilities, and drive circuit 170 may determine at what points within field of view 180 distance measurements are to be made.

Drive circuit 170 may be implemented in hardware, a programmable processor, or in any combination. For example, in some embodiments, drive circuit 170 is implemented in an application specific integrated circuit (ASIC). Further, in some embodiments, some of the faster data path control is performed in an ASIC and overall control is provided by a software programmable microprocessor. Examples of drive circuit implementations are described further below.

Photodetector 122 may be implemented using any suitable light detecting device. For example, in some embodiments PD 122 may be implemented by a PIN photodiode, a Silicon photomultiplier (SiPM), or an avalanche photodiode (APD). PD 122 detects IR light that is reflected from points within field of view 180. For example, when IR light pulses are scanned in the field of view and reflected off either a background surface or other objects in the field of view, PD 122 detects the reflections.

Time-of-flight (TOF) detection circuit 124 receives IR pulse timing information from drive circuit 170 and compares it to the timing of a received IR pulse to determine the TOF of an IR pulse, thereby measuring the distance to the either the projection surface or an object in the field of view. TOF detection circuit 124 may be implemented using any suitable circuit structures. For example, in some embodiments, TOF detection circuit 124 includes amplifiers, integrators, analog-to-digital converters, and the like.

Depth map storage 126 receives three dimensional (3D) data from TOF detection circuit 124 for various reflection points in the field of view and stores this data as a depth map. Depth map data stored in storage 126 may be used for any purpose. For example, in some embodiments, depth map data may be used for detecting an object in the field of view, gesture recognition, object recognition, or the like.

Depth map storage 126 may be implemented using any suitable circuit structure. For example, in some embodiments, depth map storage 126 is implemented in a dual port memory device that can be written on one port and read on a second port. In other embodiments, depth map storage 126 is implemented as data structures in a general purpose memory device. In still further embodiments, depth map storage 126 is implemented in an application specific integrated circuit (ASIC).

Figure 2:
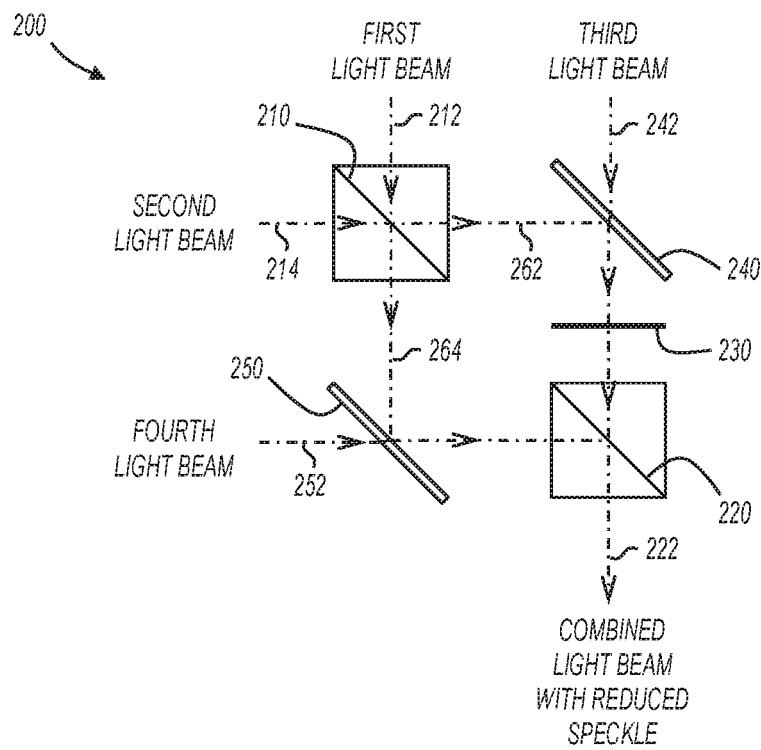
FIG. 2 shows a top view of a beam combining optical device in accordance with various embodiments of the present invention.

FIG. 2 shows a top view of a beam combining optical device in accordance with various embodiments of the present invention. Beam combining optical device 200 is an example embodiment of beam combining optics with speckle reduction 130 (FIG. 1). In laser beam scanning displays, speckle is a common image nuisance. The basic principle of speckle reduction is the averaging of independent speckle patterns. The speckle patterns must be uncorrelated and non-interfering (i.e., not temporally correlated) to contribute to speckle reduction on the screen.

By splitting the light power of a polarized beam source and adding an optical path delay between the two newly created beams, various embodiments of the present invention make the two laser beams temporally incoherent. After recombining spatially these two beams in a polarizing beam splitter cube, the two beams are cross-polarized and of equal power, then a maximum speckle reduction factor of $\sqrt{2}$ (~30% improvement) is possible if the two speckle patterns are fully uncorrelated.

Beam combining optical device 200 includes non-polarizing beam splitter 210, polarizing beam splitter 220, polarization rotation component 230, and dichroic mirrors 240 and 250. Beamsplitter 210 receives two laser light beams shown by rays 212, 214. In some embodiments, the first and second light beams have different wavelengths. For example, in some embodiments, the first light beam may be a green laser light beam and the second light beam may be a red laser light beam. In some embodiments, the first or second light beams or both light beams consist of multiple light beams that have been previously combined. For example, in some embodiments, the first laser beam comprise a red laser beam and a green laser beam that have been previously combined and the second laser beam comprises a red laser beam and a green laser beam that have been previously combined. Any combination of wavelengths of light may be combined to form either the first or second laser beams without departing from the scope of the present invention.

Beamsplitter 210 reflects a portion of the first light beam and transmits the remaining portion of the first light beam. Beamsplitter 210 also reflects a portion of the second light beam and transmits the remaining portion of the remaining light beam. In some embodiments, the reflected portion is around 50% of the incident light beam and the transmitted portion is also around 50% of the incident light beam, but this is not a limitation of the present invention. Any amount of light may be transmitted by beamsplitter 210 without departing from the scope of the present invention.

The first and second light beams are orientated so that the reflected path from the first light beam aligns with the transmitted path from the second beam to form a first combined light beam on a first path 262. The first and second light beams are also orientated so that the transmitted path from the first light beam aligns with the reflected path from the second light beam to form a second combined light beam on a second path 264. First path 262 is considered to be the entire light path from the point that the first and second light paths diverge at beamsplitter 210 to the point at which they are recombined at beamsplitter 220. Likewise, second path 264 is considered to be the entire light path from the point that the first and second light paths diverge at beamsplitter 210 to the point at which they are recombined at beamsplitter 220.

The first combined light beam in the first path 262 is reflected off dichroic mirror 240. In some embodiments, a third light beam may be transmitted through dichroic mirror 240 so that it is aligned to the reflected beam. An example third beam is shown as ray 242. The beam reflected off dichroic mirror 240 and any transmitted beams continue along first path 262 and are then passed through rotation polarization device 230. Polarization rotation device 230 may be any type of device that rotates the polarization of incident light. For example, in some embodiments, polarization rotation device 230 is a half waveplate orientated such that the polarization of all incident light beams is rotated 90 degrees. The light beam after polarization rotation device 230 continues along first path 262 and is directed to polarizing beam splitter 220.

The second combined light beam in the second path 264 is reflected off dichroic mirror 250. In some embodiments, a fourth light beam may be transmitted through dichroic mirror 250 so that it is aligned to the reflected beam. An example fourth beam is shown as ray 252. The beam reflected off dichroic mirror 250 and any transmitted beams continue along second path 264 and are then introduced to polarizing beam splitter 220 from a direction such that if the light beams in the second path 264 are reflected off the polarizer, they align with a light beam resulting from a light beam in the first path 262 that is transmitted through polarizing beam splitter 220 resulting in output beam 222. Likewise, some embodiments orient beam splitter 220 such that a light beam in the first path 262 is reflected and a light beam in the second path 264 is transmitted, and the resulting reflected and transmitted beams are aligned to create output beam 222.

As used herein, the term "optical path length" is defined as the product of the geometric path length and the index of refraction of the medium that the path is in. In some embodiments, the polarization of path 262 is rotated enough and the optical path lengths of first path 262 and second path 264 differ by an amount great enough to provide speckle reduction for both first light beam 212 and second light beam 214. For example, in some embodiments, the difference in optical path lengths of first path 262 and 264 is greater than the coherence length of the light source.

For a Gaussian beam, coherence length is defined as:

$$\frac{2\ln(2)}{n\pi} \times \frac{l^2}{\Delta l}, \quad (1)$$

where n is the index of refraction of the medium, l is the central wavelength of the beam, and Δl is the full width half maximum spectral width of the beam. Although in some embodiments the difference in optical path lengths is greater than the coherence length of the light source, this is not a limitation of the present invention. For example, in some embodiments, the difference in optical path lengths is less than the coherence length of the light source.

In some embodiments, differences in optical path lengths between first path 262 and second path 264 are achieved solely through geometric path length differences, and in other embodiments, differences in optical path lengths between first path 262 and second path 264 are achieved solely through differences in indices of refraction in the two paths. In still further embodiments, differences in optical path lengths between first path 262 and second path 264 are achieved through a combination of geometric path length differences and differences in indices of refraction. These and other embodiments are described further below.

Any color laser light may be combined and speckle reduced as described. For example, in some embodiments, first light beam 212 may be a red laser beam and second light beam 214 may be a green laser beam resulting in both the red and green light having reduced speckle in the final image. In these embodiments, third light beam may be a blue laser beam and fourth beam may be an IR laser beam. This results in red and green laser light going through speckle reduction, and then combined with blue and infrared laser light, which do not go through speckle reduction.

Figure 3:
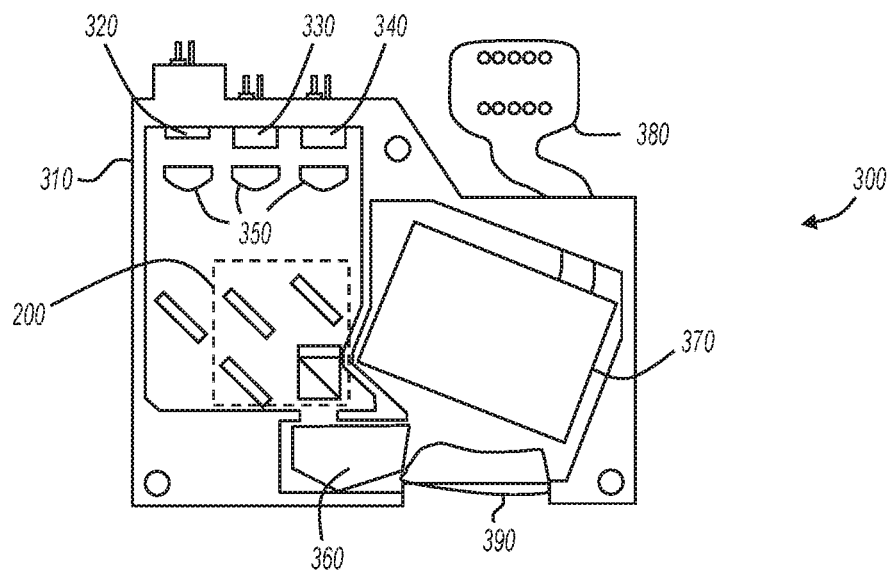
FIG. 3 shows a top view of a scanning engine with the beam combining optical device of FIG. 2 in accordance with various embodiments of the present invention.

FIG. 3 shows a top view of a scanning engine with the beam combining optical device of FIG. 2 in accordance with various embodiments of the present invention. Scanning engine 300 is an example embodiment of scanning engine 140 (FIG. 1). Scanning engine 300 includes carrier assembly 310, laser light sources 320, 330, and 340, collimating lenses 350, combining optics with speckle reduction 200, fold mirror 360, scanning engine 370, lens 390, and connector 380.

Laser light sources 320, 330, and 340 are laser diodes that are example embodiments of laser light sources 120. In some embodiments, laser light source 320 emits red light, laser light source 330 emits green light, and laser light source 340 emits blue light. In operation, laser light sources 320, 330, and 340 emit light that is collimated or focused by collimating lenses 350 and then combined and speckle reduced by optics 200 as described above with reference to FIG. 2. Fold mirror 360 receives the combined reduced speckle output beam from optics 200 and provides it to scanning device 370. In some embodiments, scanning device 370 includes a single biaxial scanning mirror as shown in FIG. 1. In other embodiments, scanning device 370 includes two single axis mirrors. This is described further below with reference to later figures. Connector 380 is used to provide an electrical connection to scanning device 370.

Figure 4:
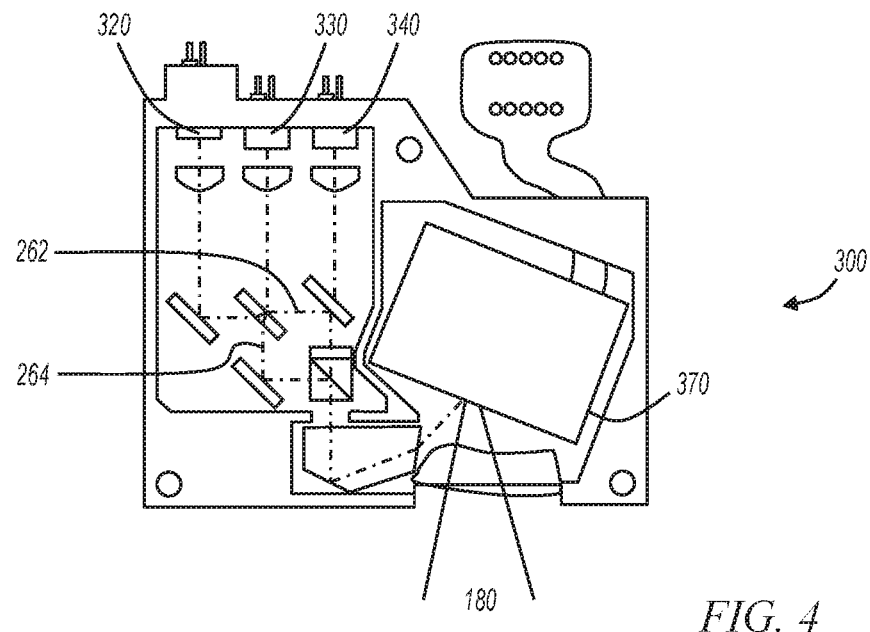
FIG. 4 shows the scanning engine of FIG. 3 with laser beam paths in accordance with various embodiments of the present invention.

FIG. 4 shows the scanning engine of FIG. 3 with laser beam paths in accordance with various embodiments of the present invention. Laser light produced by laser diodes 320 and 330 is combined and split into first path 262 and second path 264. First path 262 and second path 264 are of unequal optical path lengths as described above. The fold mirror receives the combined reduced speckle output beam from the beam combining optics with speckle reduction, and then provides it to scanning device 370 which scans it into field of view 180. In embodiments represented by FIG. 4, a third beam is introduced into first path 262 using a dichroic mirror, and no further beam is introduced into second path 264.

Figure 5:
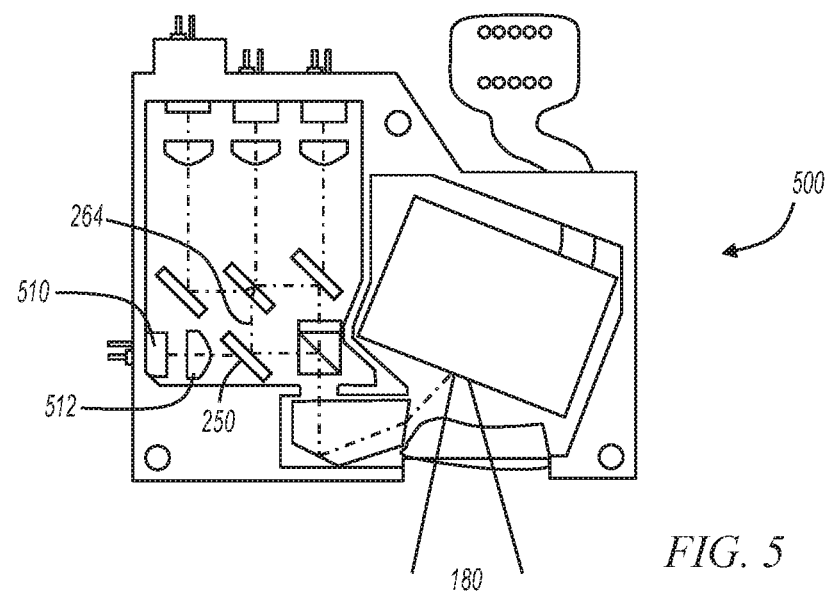
FIG. 5 shows the scanning engine of FIG. 4 with a fourth laser diode in accordance with various embodiments of the present invention.

FIG. 5 shows the scanning engine of FIG. 4 with a fourth laser diode in accordance with various embodiments of the present invention. Scanning engine 500 is similar to scanning engine 300 (FIGS. 3, 4) with the exception that scanning engine 500 includes fourth laser diode 510 and collimating lens 512. Laser diode 510 is positioned such that light emitted from laser diode 510 enters second path 264 through dichroic mirror 250. In some embodiments, laser diode 510 emits IR laser light. In these embodiments, light scanned into field of view 180 includes red, green, blue, and IR laser light.

Figure 6:
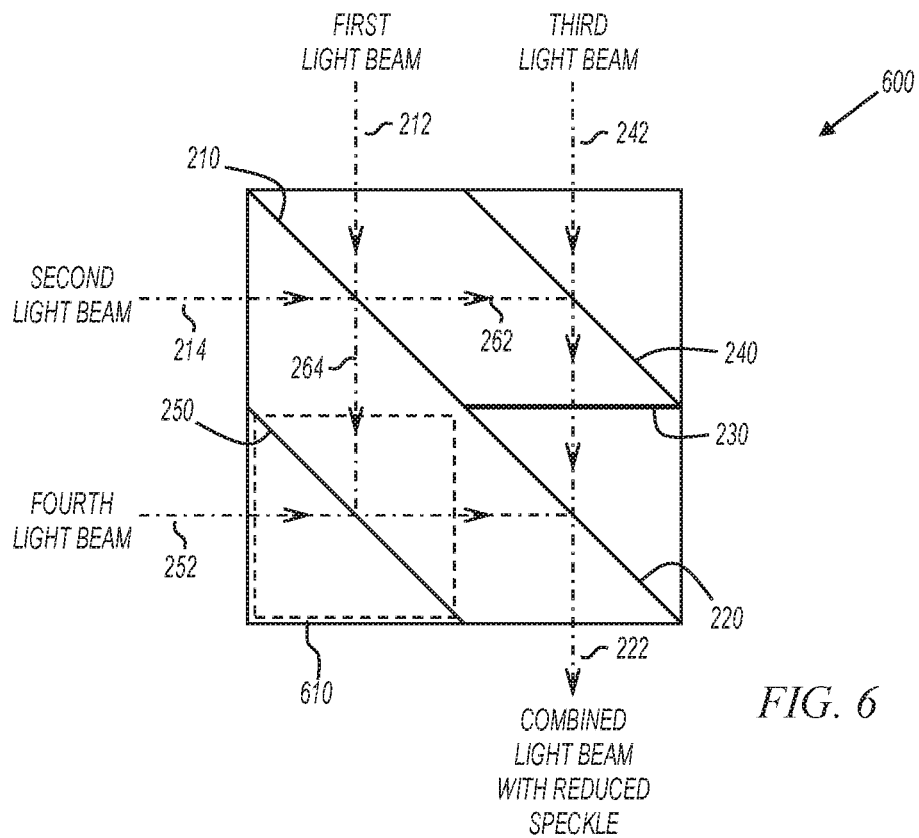
FIG. 6 shows a top view of a cemented beam combining optical device in accordance with various embodiments of the present invention.

FIG. 6 shows a top view of a cemented beam combining optical device in accordance with various embodiments of the present invention. Cemented beam combining optical device 600 is an example embodiment of beam combining optics with speckle reduction 130 (FIG. 1). Cemented beam combining optical device 600 includes non-polarizing beam splitter 210, polarizing beam splitter 220, polarization rotation component 230, and dichroic mirrors 240 and 250.

Beamsplitter 210 receives two laser light beams shown by rays 212, 214. In some embodiments, the first and second light beams have different wavelengths. For example, in some embodiments, the first light beam may be a green laser light beam and the second light beam may be a red laser light beam. Beamsplitter 210 reflects a portion of the first light beam and transmits the remaining portion of the first light beam. Beamsplitter 210 also reflects a portion of the second light beam and transmits the remaining portion of the remaining light beam. In some embodiments, the reflected portion is around 50% of the incident light beam and the transmitted portion is also around 50% of the incident light beam, but this is not a limitation of the present invention. Any amount of light may be transmitted by beamsplitter 210 without departing from the scope of the present invention.

The first and second light beams are orientated so that the reflected path from the first light beam aligns with the transmitted path from the second beam to form a first combined light beam on a first path 262. The first and second light beams are also orientated so that the transmitted path from the first light beam aligns with the reflected path from the second light beam to form a second combined light beam on a second path 264. First path 262 is considered to be the entire light path from the point that the first and second light paths diverge at beamsplitter 210 to the point at which they are recombined at beamsplitter 220. Likewise, second path 264 is considered to be the entire light path from the point that the first and second light paths diverge at beamsplitter 210 to the point at which they are recombined at beamsplitter 220.

The first combined light beam in the first path 262 is reflected off dichroic mirror 240. In some embodiments, a third light beam may be transmitted through dichroic mirror 240 so that it is aligned to the reflected beam. An example third beam is shown as ray 242. The beam reflected off dichroic mirror 240 and any transmitted beams continue along first path 262 and are then passed through rotation polarization device 230. Polarization rotation device 230 may be any type of device that rotates the polarization of incident light. For example, in some embodiments, polarization rotation device 230 is a half waveplate orientated such that the polarization of all incident light beams is rotated 90 degrees. The light beam after polarization rotation device 230 continues along first path 262 and is directed to polarizing beam splitter 220.

The second combined light beam in the second path 264 is reflected off dichroic mirror 250. In some embodiments, a fourth light beam may be transmitted through dichroic mirror 250 so that it is aligned to the reflected beam. An example fourth beam is shown as ray 252. The beam reflected off dichroic mirror 250 and any transmitted beams continue along second path 264 and are then introduced to polarizing beam splitter 220 from a direction such that if the light beams in the second path 264 are reflected off the polarizer, they align with a light beam resulting from a light beam in the first path 262 that is transmitted through polarizing beam splitter 220 resulting in output beam 222. Likewise, some embodiments orient beam splitter 220 such that a light beam in the first path 262 is reflected and a light beam in the second path 264 is transmitted, and the resulting reflected and transmitted beams are aligned to create output beam 222.

Cemented beam combining optical device 600 is an example device that has two light paths with different optical lengths due to differences in indices of refraction. For example, area 610 within optical device 600 may have an index of refraction that differs from an index of refraction elsewhere in optical device 600. Because light path 264 traverses area 610, the optical path lengths of first path 262 and second path 264 are different. Any part or area of optical device 600 may have varying indices of refraction to effect different optical path lengths without departing from the scope of the present invention.

Optical device 600 is similar to optical device 200 (FIG. 2) with the exception that the individual devices are cemented together in optical device 600. For example, each of the beam splitters, dichroic mirrors, and polarization rotation component are formed on substrates which are cemented together to form optical device 600. Each of the substrates, or part of each of the substrates, may have varying indices of refraction in order to create multiple light paths with different optical path lengths.

Figure 7:
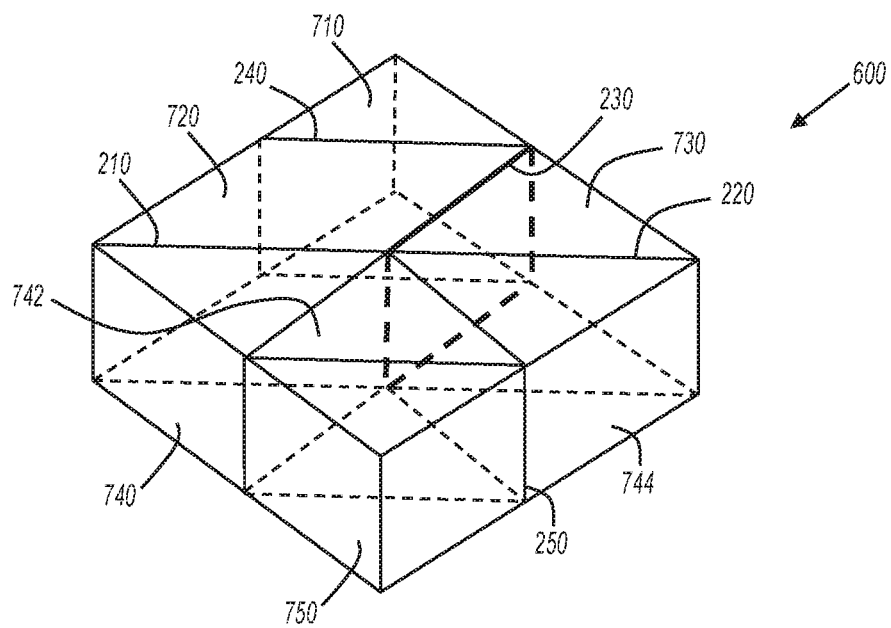
FIG. 7 shows a perspective view of the cemented beam combining device of FIG. 6 in accordance with various embodiments of the present invention.

FIG. 7 shows a perspective view of the cemented beam combining optical device of FIG. 6 in accordance with various embodiments of the present invention. The perspective view of cemented beam combining optical device 600 shows optical substrates 710, 720, 730, 740, 742, 744, and 750 between beam splitters 210 and 220, dichroic mirrors 240 and 250, and rotation polarization device 230. Substrates 710, 720, 730, 740, 742, 744, and 750 may be made of any material including glass or plastic, and may have any index of refraction. For example, substrates 710, 720, 730, 740, and 744 may be made of a first material having a first index of refraction, and substrates 742 and 750 may be made of a second material having a second index of refraction to effect different optical path lengths between beam splitters 210 and 220. Cemented beam optical device 600 may be manufactured by depositing optical layers on various surfaces of the substrates and then cementing the substrates together. Cemented beam optical device 600 has many advantages, including a fixed geometric relationship between the various optical components once cemented.

Figure 8:
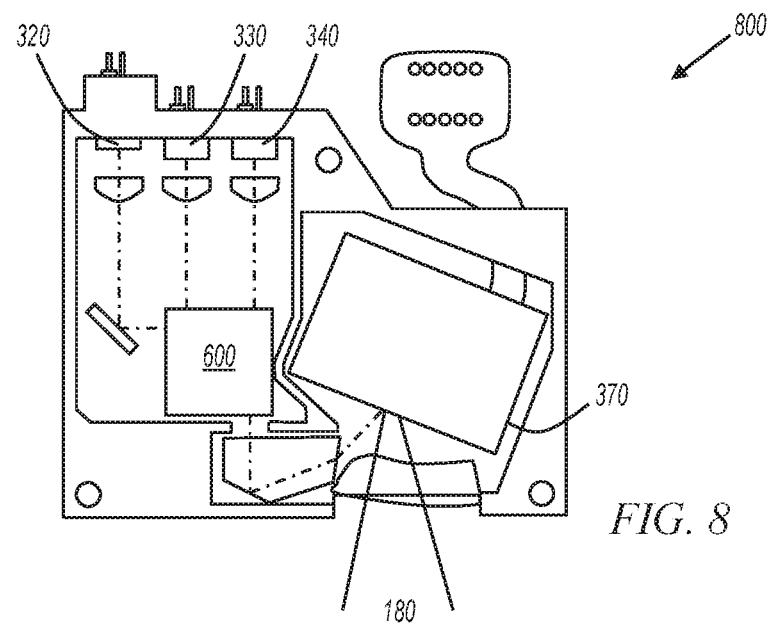
FIG. 8 shows a top view of a scanning engine with the cemented beam combining optical device of FIG. 7 in accordance with various embodiments of the present invention.

FIG. 8 shows a top view of a scanning engine with the cemented beam combining optical device of FIG. 7 in accordance with various embodiments of the present invention. Scanning engine 800 includes three laser diodes 320, 330, and 340, cemented beam combining optical device 600, and scanning device 370. Cemented beam combining optical device 600 combines and reduces speckle of laser beams received from the laser diodes and provides the combined reduced speckle laser beam to scanning device 370 to be scanned in field of view 180.

Figure 9:
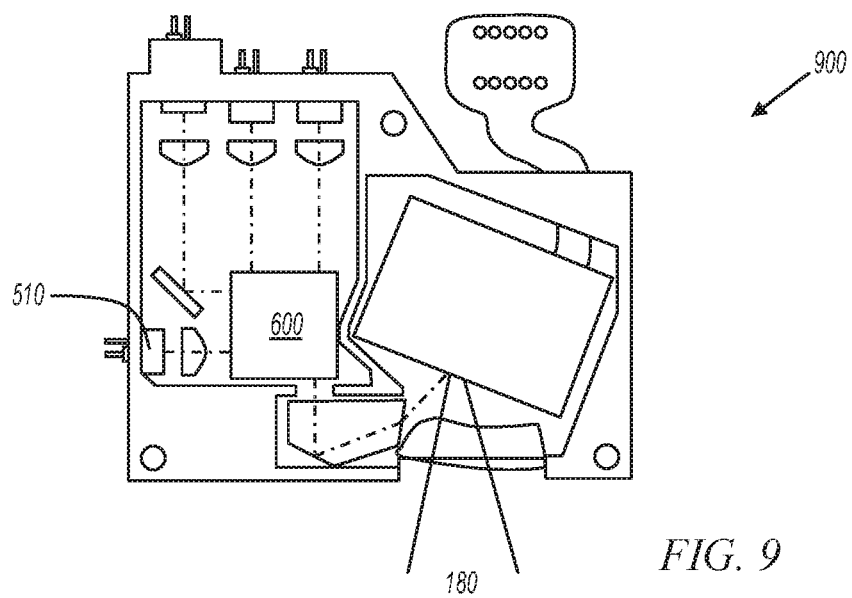
FIG. 9 shows the scanning engine of FIG. 8 with a fourth laser diode in accordance with various embodiments of the present invention.

FIG. 9 shows the scanning engine of FIG. 8 with a fourth laser diode in accordance with various embodiments of the present invention. Scanning engine 900 includes fourth laser diode 510. Laser light from laser diode 510 is combined in the second light path within optical device 600 using a dichroic mirror as described above.

Figure 10:
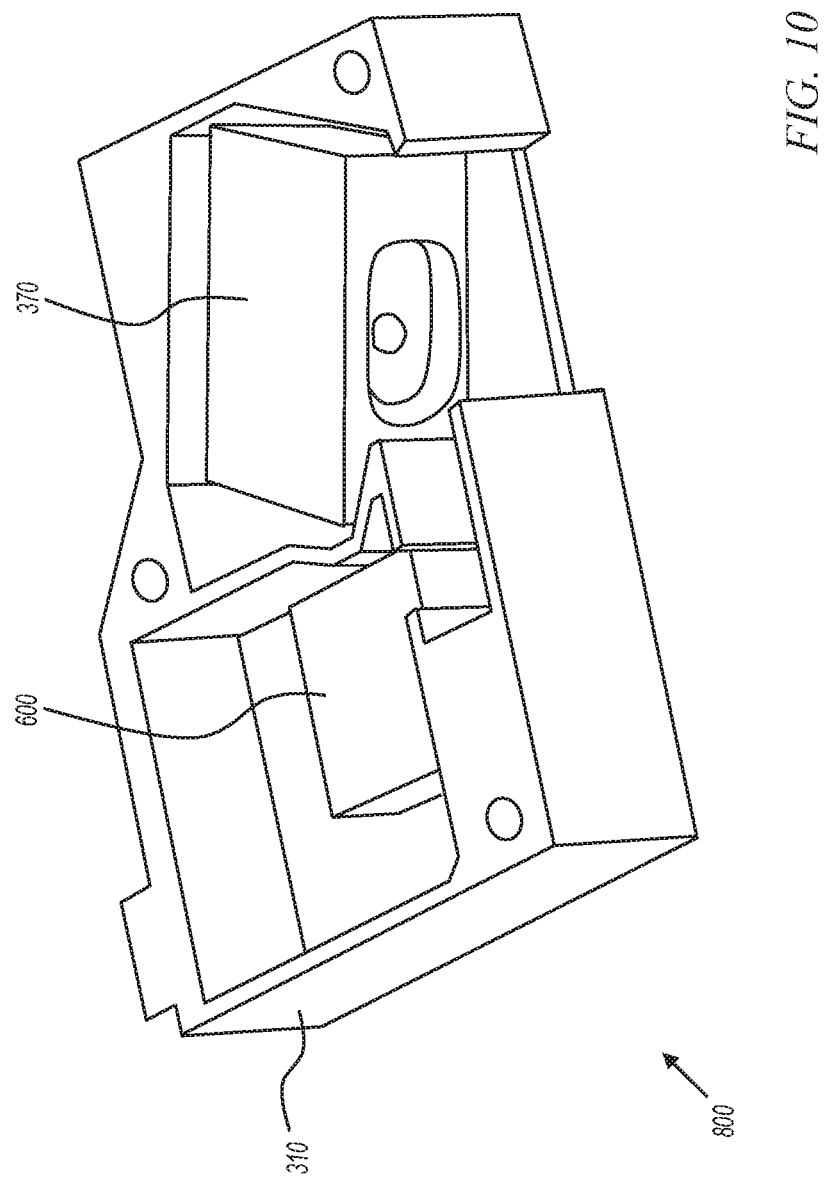
FIG. 10 shows a perspective view of a scanning engine with the cemented beam combining optical device of FIG. 7 in accordance with various embodiments of the present invention.

FIG. 10 shows a perspective view of a scanning engine with the cemented beam combining optical device of FIG. 7 in accordance with various embodiments of the present invention. Scanning engine 800 is shown having cemented beam combining optical device 600 and scanning device 370. The remaining components (e.g., laser diodes, collimating optics, etc.) are not shown.

Figure 11:
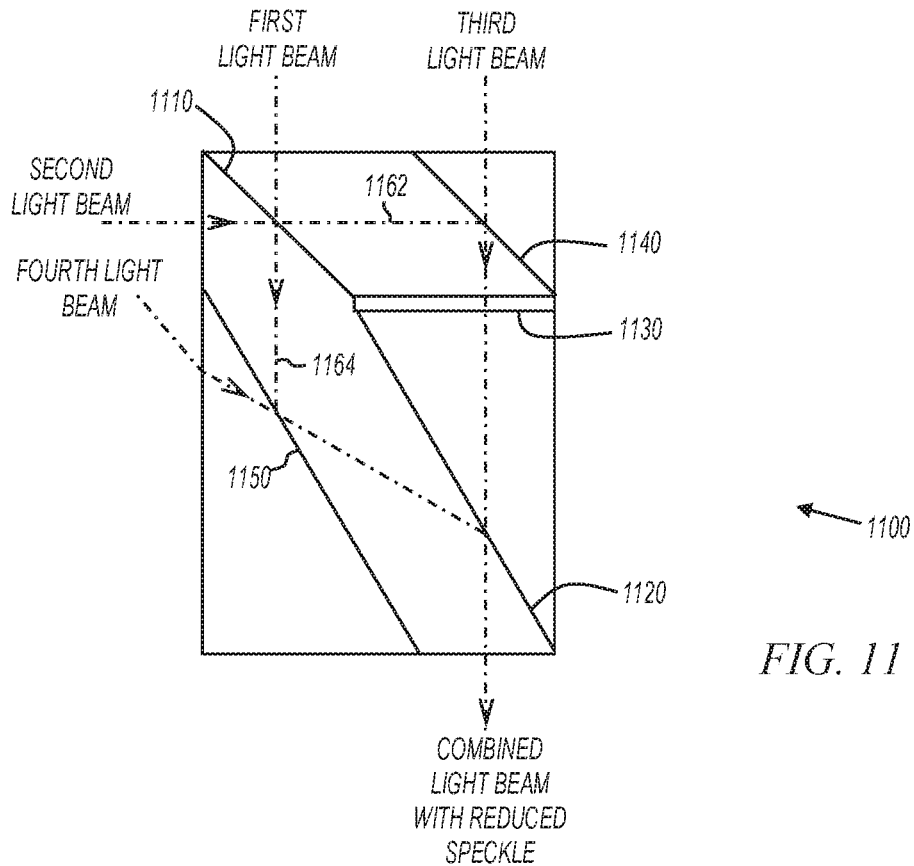
FIG. 11 shows a top view of a beam combining optical device in accordance with various embodiments of the present invention.

FIG. 11 shows a top view of a beam combining optical device in accordance with various embodiments of the present invention. Beam combining optical device 1100 receives four laser beams similar to optical devices 200 (FIG. 2), and 600 (FIG. 6) described above. Optical device 1100 combines the first and second beams using nonpolarizing beam splitter 1110 and splits the combined beam into first light path 1162 and second light path 1164. Dichroic mirror 1140 combines the third light beam into first path 1162 and dichroic mirror 1150 combines the fourth light beam in second path 1164. First light path 1162 passes through polarization rotation device 1130, and then light paths 1162, 1164 are recombined using polarizing beamsplitter 1120.

First path 1162 and 1164 have different geometric path lengths which result in different optical path lengths. The different optical path lengths and polarization rotation of path 1162 result in speckle reduction of the first and second light beams as described above. Optical device 1100 may be used in any of the scanning engines described herein. For example, in some embodiments, with proper alignment of laser diodes, optical device 1100 can be used to combine and reduce the speckle of laser light in scanning engines 800 (FIG. 8) or scanning engine 900 (FIG. 9). Optical device 1100 is shown as a cemented optical device; however this is not a limitation of the present invention. For example, in some embodiments, optical device 1100 includes discrete optical components that are not cemented together.

Figure 12:
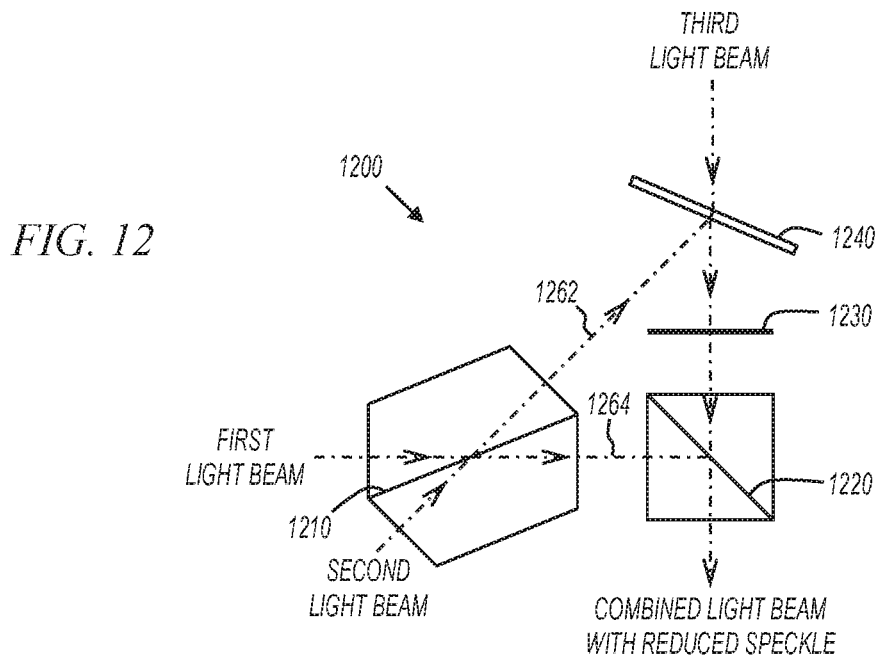
FIG. 12 shows a top view of a beam combining optical device in accordance with various embodiments of the present invention.

FIG. 12 shows a top view of a beam combining optical device in accordance with various embodiments of the present invention. Beam combining optical device 1200 combines fewer laser beams than previously described embodiments, but also uses fewer components than previously combined embodiments. Optical device 1200 includes non polarizing beam splitter 1210, polarizing beam splitter 1220, dichroic mirror 1240, and polarization rotation device 1230. The first and second light beams are orientated such that the first light path 1262 is directed to dichroic mirror 1240 and second light path 1264 is directed to polarizing beam splitter 1220. After the dichroic mirror 1240, light path 1262 passes through polarization rotation device 1230 and is then directed to polarizing beam splitter 1220 where it is combined with light from first light path 1264 to produce the combined reduced speckle output beam.

First path 1262 and 1264 have different geometric path lengths which result in different optical path lengths. The different optical path lengths, combined with the polarization rotation of path 1262 result in speckle reduction of the first and second light beams as described above. Optical device 1200 may be used in any of the scanning engines described herein. For example, in some embodiments, with proper alignment of laser diodes, optical device 1100 can be used to combine and reduce the speckle of laser light in scanning engines 800 (FIG. 8). Optical device 1200 is shown as discrete optical elements; however this is not a limitation of the present invention. For example, in some embodiments, optical device 1200 includes optical devices that are cemented together.

Figure 13:
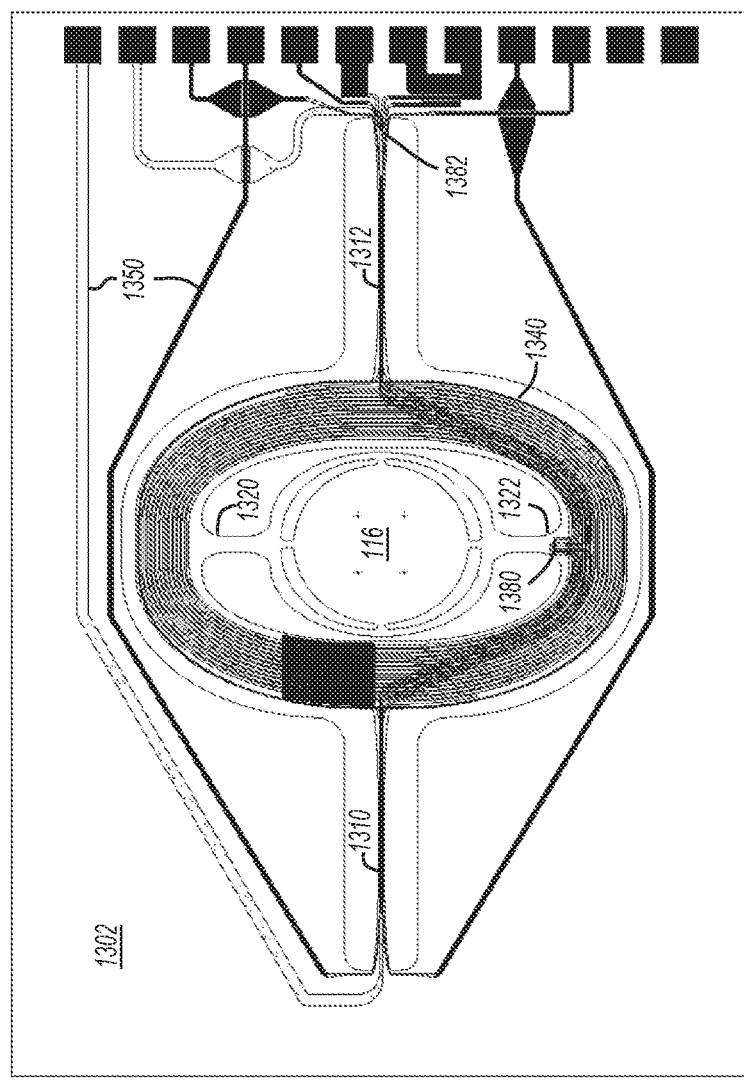
FIG. 13 shows a plan view of a scanning device in accordance with various embodiments of the present invention.

FIG. 13 shows a plan view of a scanning device in accordance with various embodiments of the present invention. Scanning device 114 is a microelectromechanical system (MEMS) device with a scanning mirror. Scanning device 114 includes fixed platform 1302, scanning platform 1340, and scanning mirror 116. Scanning platform 1340 is coupled to fixed platform 1302 by flexures 1310 and 1312, and scanning mirror 116 is coupled to scanning platform 1340 by flexures 1320 and 1322. Scanning platform 1340 has a drive coil connected to drive lines 1350, which are driven by a drive signal provided on node 173 from summer 185 (FIG. 1). The drive signal includes an excitation signal to excite resonant motion of scanning mirror 116 on the fast-scan axis, and also includes a slow-scan drive signal to cause non-resonant motion of scanning platform 1340 on the slow-scan axis. Current driven into drive lines 1350 produces a current in the drive coil.

In operation, an external magnetic field source (not shown) imposes a magnetic field on the drive coil. The magnetic field imposed on the drive coil by the external magnetic field source has a component in the plane of the coil, and is oriented non-orthogonally with respect to the two drive axes. The in-plane current in the coil windings interacts with the in-plane magnetic field to produce out-of-plane Lorentz forces on the conductors. Since the drive current forms a loop on scanning platform 1340, the current reverses sign across the scan axes. This means the Lorentz forces also reverse sign across the scan axes, resulting in a torque in the plane of and normal to the magnetic field. This combined torque produces responses in the two scan directions depending on the frequency content of the torque.

The long axis of flexures 1310 and 1312 form a pivot axis. Flexures 1310 and 1312 are flexible members that undergo a torsional flexure, thereby allowing scanning platform 1340 to rotate on the pivot axis and have an angular displacement relative to fixed platform 1302. Flexures 1310 and 1312 are not limited to torsional embodiments as shown in FIG. 13. For example, in some embodiments, flexures 1310 and 1312 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

Scanning mirror 116 pivots on a first axis formed by flexures 1320 and 1322, and pivots on a second axis formed by flexures 1310 and 1312. The first axis is referred to herein as the horizontal axis or fast-scan axis, and the second axis is referred to herein as the vertical axis or slow-scan axis. The distinction between vertical and horizontal is somewhat arbitrary, since a rotation of the scanning mirror will cause a rotation of the two axes. Accordingly, the various embodiments of the present invention are not to be limited by the terms "horizontal" and "vertical."

In some embodiments, scanning mirror 116 scans at a mechanically resonant frequency on the fast-scan axis resulting in a sinusoidal vertical sweep. Further, in some embodiments, scanning mirror 116 scans at a non-resonant frequency on the slow-scan axis, so the horizontal scan frequency and angular extents can be controlled independently.

Scanning device 114 also incorporates one or more integrated piezoresistive position sensors. Piezoresistive sensor 1380 produces a voltage that represents the displacement of mirror 116 with respect to scanning platform 1340, and this voltage is provided as the feedback FSYNC signal on node 175 (FIG. 1). Piezoresistive sensor 1382 produces a voltage that represents the displacement of scanning platform 1340 with respect to fixed platform 1302, and this voltage is provided as the slow-scan position feedback signal on node 177 (FIG. 1). As shown in FIG. 13, in some embodiments, position sensors are provided on both scan axes, although this is not a limitation of the present invention. For example, in some embodiments, scanning device 114 includes a position sensor on only one axis. In some embodiments, one or more analog-to-digital converters are included to digitize the voltages produced by the piezoresistive position sensors. In these embodiments, one or both of the FSYNC signal and slow-scan position feedback signal are provided as streams of digital data.

The particular MEMS device embodiment shown in FIG. 13 is provided as an example, and the various embodiments of the invention are not limited to this specific implementation. For example, any combination of scanning mirrors capable of sweeping in two dimensions to reflect a light beam in a raster pattern may be incorporated without departing from the scope of the present invention. Also for example, any combination of scanning mirrors (e.g., two mirrors: one for each axis) may be utilized to reflect a light beam in a raster pattern. Further, any type of mirror drive mechanism may be utilized without departing from the scope of the present invention. For example, although scanning device 114 uses a drive coil on a moving platform with a static magnetic field, other embodiments may include a magnet on a moving platform with drive coil on a fixed platform. Further, the mirror drive mechanism may include an electrostatic and/or a piezoelectric drive mechanism.

Figure 14:
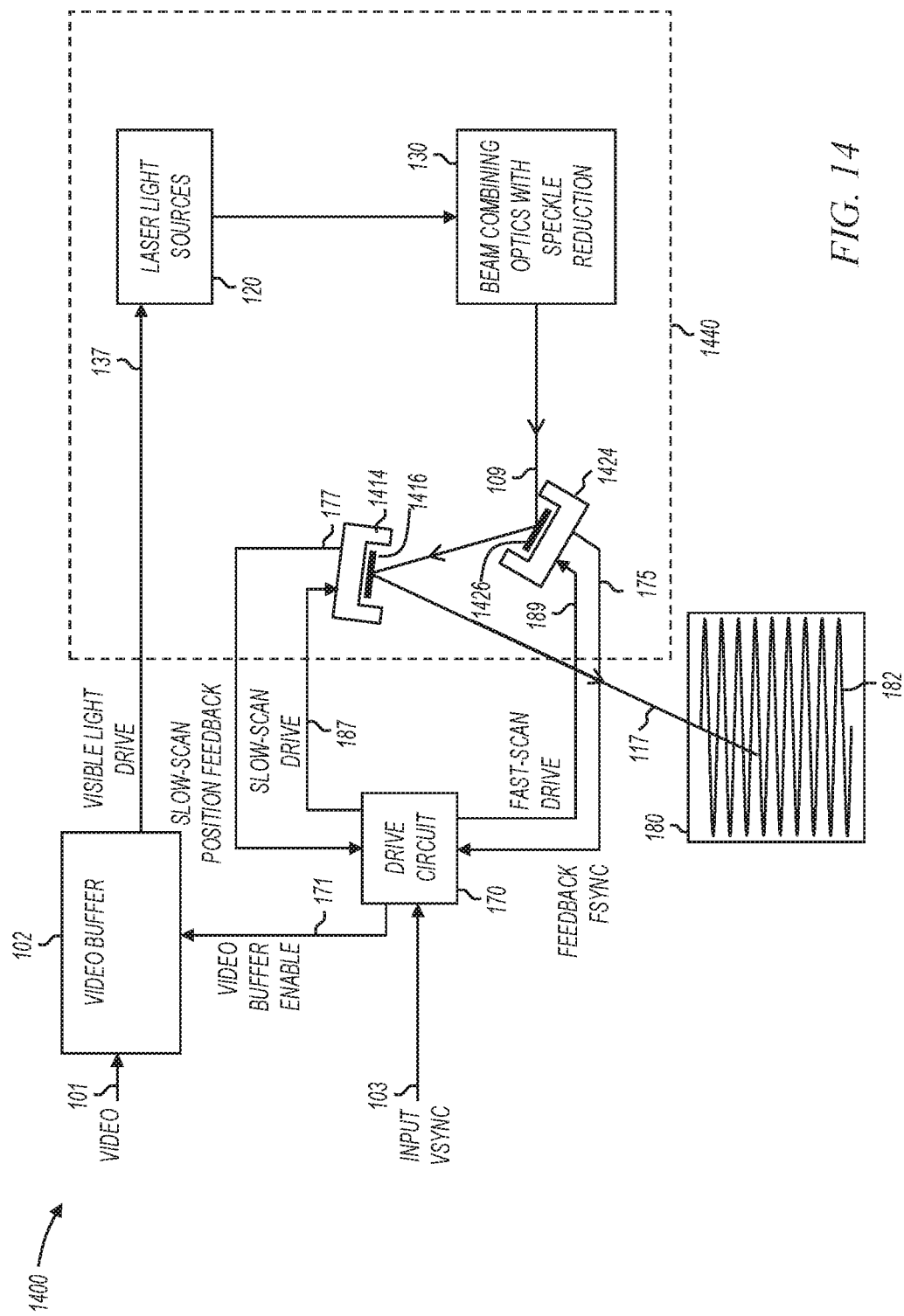
FIG. 14 shows a scanning laser projection system in accordance with various embodiments of the present invention.

FIG. 14 shows a scanning laser projection system in accordance with various embodiments of the present invention. Laser projection system 1400 is similar to laser projection system 100 (FIG. 1) with the exception that the scanning engine 1440 includes two scanning mirrors instead of one. In some embodiments, a first MEMS device 1424 includes a scanning mirror 1426 configured to deflect along one axis and a second MEMS device 1414 includes a scanning mirror 1416 configured to deflect along a second axis that is largely perpendicular to the first axis. Furthermore, in some embodiments, the first mirror is used for fast-scan motion, while the second mirror is used for slow-scan motion. In some embodiments, the fast-scan motion comprises resonant sinusoidal motion while the slow-scan motion comprises non-resonant quasi-static controlled motion.

Drive circuit 170 provides a fast-scan drive signal to MEMS device 1424 on node 189 to excite motion of mirror 1426, and receives a feedback sync signal FSYNC on node 175. Drive circuit 170 also provides a slow-scan drive signal to MEMS device 1414 on node 187 to excite motion of mirror 1416 and receives a slow-scan position feedback signal on node 177.

Scanning projection system may also include one or more IR light sources, an IR photodetector, time-of-flight measurement circuitry, and depth map data storage. These are described above with reference to FIG. 1.

FIG. 15 shows a perspective view of a MEMS device with a scanning mirror in accordance with various embodiments of the present invention. MEMS device 1424 includes fixed platforms 1502, scanning platform 1500, and scanning mirror 1426. Scanning platform 1500 is coupled to fixed platforms 1502 by flexures 1506. Scanning platform 1500 has a drive coil 1508 connected to contacts 1510, which are driven by a fast-scan drive signal provided on node 189 from drive control circuit 170 (FIG. 14).

The axis of flexures 1506 forms a pivot axis. Flexures 1506 are flexible members that undergo a torsional flexure, thereby allowing scanning platform 1500 to rotate on the pivot axis and have an angular displacement relative to fixed platforms 1502. Flexures 1506 are not limited to torsional embodiments as shown in FIG. 15. For example, in some embodiments, flexures 1506 take on other shapes such as arcs, "S" shapes, or other serpentine shapes.

In operation, an external magnetic field source (not shown) imposes a magnetic field on the drive coil. The magnetic field imposed on the drive coil by the external magnetic field source has a component in the plane of the coil. The in-plane current in the coil windings interacts with the in-plane magnetic field to produce out-of-plane Lorentz forces on the conductors. Since the drive current forms a loop on scanning platform 1500, the current reverses sign across the scan axis. This means the Lorentz forces also reverse sign across the scan axis, resulting in a torque in the plane of and normal to the magnetic field. This combined torque produces a response on the scan axis depending on the frequency content of the torque. In some embodiments, scanning platform 1500 and mirror 1426 scan at a mechanically resonant frequency on the fast-scan axis resulting in a sinusoidal sweep.

MEMS device 1424 also incorporates one or more integrated piezoresistive position sensors. Piezoresistive sensor 1520 produces a voltage that represents the displacement of scanning platform 1500 and mirror 1426 with respect to fixed platforms 1502. Piezoresistive sensor 1520 is coupled to contact 1512. The voltage on contact 1512 is provided as the feedback FSYNC signal on node 175 (FIG. 14). In some embodiments, the FSYNC signal is provided as an analog signal. In other embodiments, the FSYNC signal is digitized using a comparator (not shown) or an analog-to-digital converter (not shown) such that a digital feedback signal is provided on node 175 (FIG. 14).

Much of MEMS device 1424 can be fabricated from a single common substrate using MEMS techniques. For example, the fixed platforms 1502, the scanning platform 1500 and the two flexures 1506 can all be formed from the same substrate. Additionally, in some embodiments, the drive coil 1508 and contacts 1510 and 1512 can also be formed with any suitable MEMS technique. For example, the drive coil 1508 and contacts 1510 and 1512 can be formed by the selective deposition and patterning of conductive materials on the substrate.

FIGS. 16A and 16B show plan views of a MEMS device with a scanning mirror in accordance with various embodiments of the present invention. MEMS device 1414 includes a stationary mount portion 1602, a movable portion 1600, two flexures 1606, coil traces 1608, and contacts 1610. In operation, the movable portion 1600 facilitates the motion of the attached mirror 1416 to facilitate scanning in a laser scanning device.

The stationary mount portion 1602 is located in a central portion of the MEMS device 1414. The stationary mount portion 1602 is configured to be mounted to a die carrier in a scanner assembly (not shown in FIG. 16) or other suitable device.

The movable portion 1600 substantially surrounds the stationary mount portion 1602 and is coupled to the mirror 1616 through attachment structures (not shown). In some embodiments, the attachment structures serve to offset the mirror 1416 away from the movable portion 1600. This offset of the mirror 1416 away from the movable portion 1600 allows the mirror 1416 to rotate without impacting the stationary mount portion 1602.

The movable portion 1600 includes coil traces 1608 while the stationary mount portion 1602 includes various contacts 1610 and 1612. The coil traces 1608 are configured to interact with applied magnetic fields and generate nonresonant or quasi-static motion. In some embodiments, coil traces 1608 circumscribe the stationary mount portion 1602 so that the stationary mount portion 1602 is located substantially in the center of the coil traces 1608; however, this is not a limitation of the present invention. In some embodiments, separate and independent coil traces on either side of the stationary mount portion 1602 are used. In further embodiments, coil traces are formed on the attachment structures (not shown).

Contacts 1610 and 1612 provide electrical connections between the movable portion 1600 and stationary portion 1602. Contacts 1610 provide electrical connections to coil traces 1608, and contact 1612 provides an electrical connection to position sensor 1620.

The two flexures 1606 are located on opposing sides of the stationary mount portion 1602 and extend outwardly from the stationary mount portion 1602 to the movable portion 1600 to form a pivot axis. So configured, the two flexures 1606 flexibly couple the stationary mount portion 1602 to the movable portion 1600 to facilitate movement of the movable portion 1600 with respect to the stationary mount portion 1602 along the pivot axis. Specifically, the two flexures 1606 allow the movable portion 1600 and the mirror 1416 to rotate about the pivot axis. This rotation of the mirror 1416 facilitates the use of the mirror 1416 to reflect a laser beam through angular extents in a scan pattern.

During operation, drive circuit 170 (FIG. 14) provides a slow-scan drive signal to the coil trace 1608 through contacts 1610. The applied slow-scan drive signal creates electromagnetic interactions between the coil trace 1608 and an applied magnetic field, and those interactions excite motion of the movable portion 1600 and the attached mirror 1416. The resulting motion of mirror 1416 can be configured to reflect laser light into a pattern of scan lines, and thus can facilitate scanning laser projection and/or laser depth sensing.

MEMS device 1414 also incorporates one or more integrated piezoresistive position sensors 1620. Piezoresistive sensor 1620 produces a voltage that represents the displacement of mirror 1416 with respect to stationary portion 1602, and this voltage is provided as the slow-scan position feedback signal on node 177 (FIG. 14). In some embodiments, the slow-scan position feedback signal is provided as an analog signal. In other embodiments, the slow-scan position feedback signal is digitized using an analog-to-digital converter (not shown) such that a digital feedback signal is provided on node 177 (FIG. 14).

Much of MEMS device 1414 can be fabricated from a single common substrate using MEMS techniques. Thus, the stationary mount portion 1602, the movable portion 1600 and the two flexures 1606 can all be formed from the same substrate. Additionally, in some embodiments attachment structures can also be formed from the same substrate, while in other embodiments the attachment structures are formed separately or as part of the mirror 1416. The coil traces 1608 and contacts 1610 and 1612 can also be formed with any suitable MEMS technique. For example, the coil traces 1608 and contacts 1610 and 1612 can be formed by the selective deposition and patterning of conductive materials on the substrate.

Figure 17:
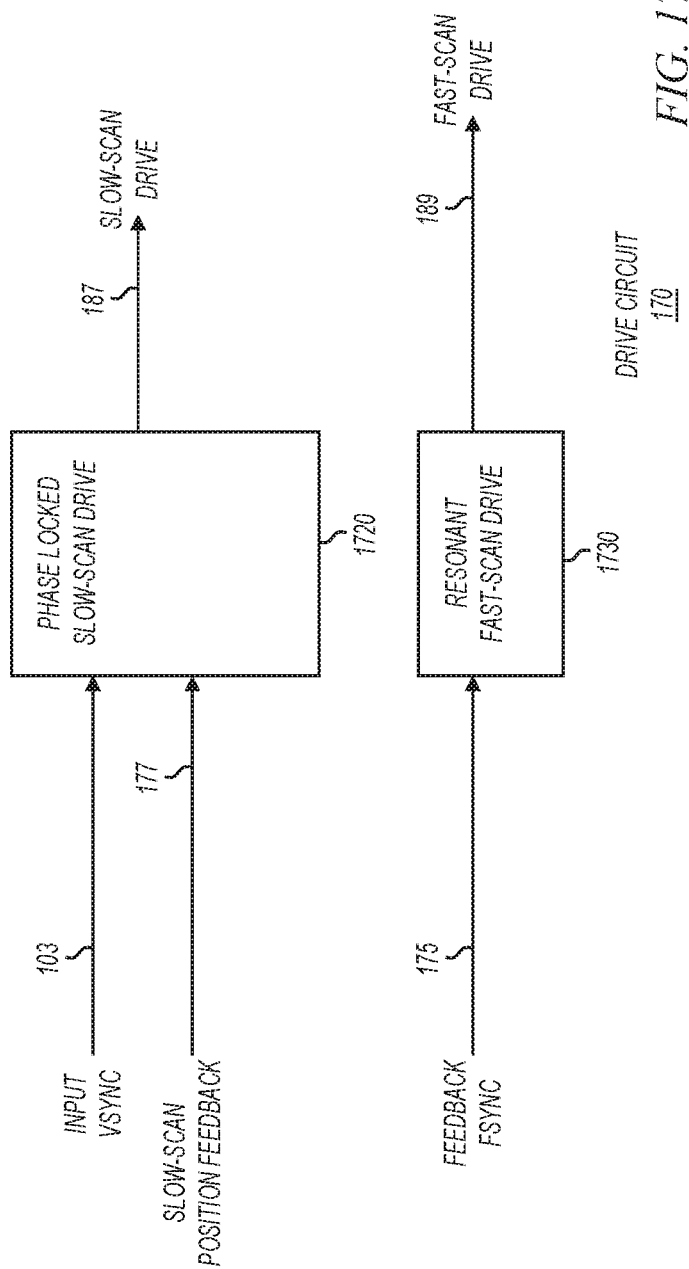
FIG. 17 shows a block diagram of a drive circuit in accordance with various embodiments of the present invention.

FIG. 17 shows a block diagram of a drive circuit in accordance with various embodiments of the present invention. Drive circuit 170 includes phase locked slow-scan drive circuit 1720 and resonant fast-scan drive circuit 1730. Phase locked slow-scan drive circuit 1720 produces the slow scan drive signal on node 187, and resonant fast-scan drive circuit 1730 produces the fast-scan drive signal on node 189.

Resonant fast-scan drive circuit 1730 provides periodic excitations to cause the scanning mirror to oscillate at the mechanical resonant frequency on the fast-scan axis. Resonant fast scan drive circuit 1730 receives the feedback FSYNC signal on node 175 as a feedback signal. Resonant fast scan drive circuit 1730 includes a control circuit that may alter the timing or amplitude of its output signal as a function of the feedback FSYNC signal.

Phase locked slow-scan drive circuit 1720 provides the slow-scan drive signal on node 187 to cause the scanning mirror to sweep on the slow-scan axis. The slow-scan drive signal on node 187 works in combination with the mirror dynamics resulting in the desired mirror movement on the slow-scan axis. Phase locked slow-scan drive circuit 1720 receives the input VSYNC signal on node 103 and the slow-scan position feedback signal from the scanning mirror on node 177. In some embodiments, phase locked slow-scan drive circuit 1720 phase locks the slow-scan drive signal on node 187 to the input VSYNC to lock the slow-scan sweep of either scanning mirror 116 (FIGS. 1, 13) or scanning mirror 1416 (FIGS. 14, 16B) to the input VSYNC Phase locked slow-scan drive circuit 1720 and resonant fast-scan drive circuit 1730 may be implemented in hardware, a programmable processor, or in any combination. For example, in some embodiments, phase locked slow-scan drive circuit 1720 and resonant fast-scan drive circuit 1730 are implemented with phase comparators, frequency multipliers and/or dividers, numerically controlled oscillators, loop filters, and the like. Also for example, phase locked slow-scan drive circuit 1720 and resonant fast-scan drive circuit 1730 may be implemented in an application specific integrated circuit (ASIC). Further, in some embodiments, some of the faster data path control is performed in an ASIC and overall control is provided by a software programmable microprocessor. The manner in which these circuits are implemented is not a limitation of the present invention.

Figure 18:
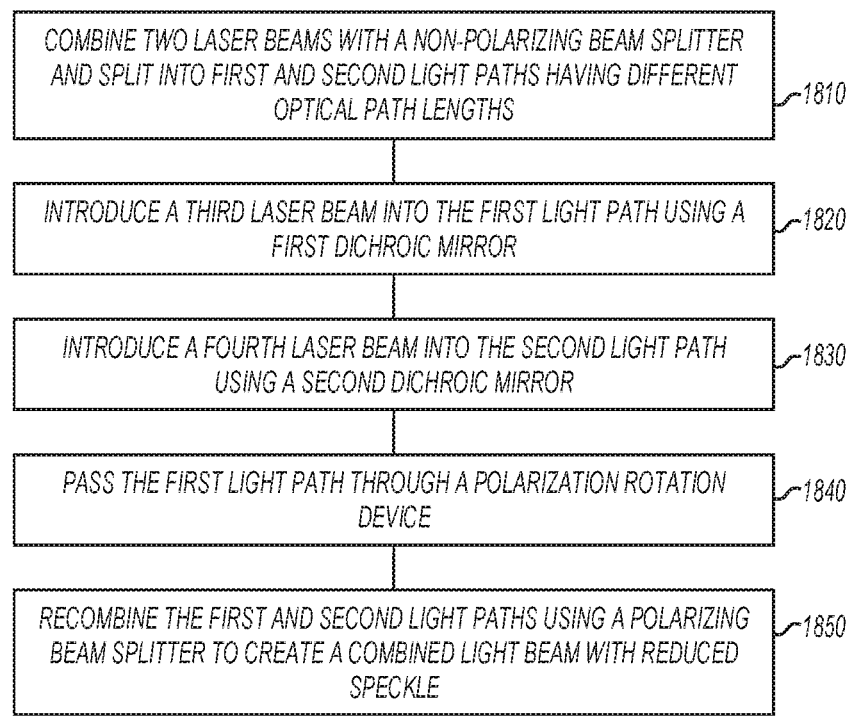
FIG. 18 shows a flow diagram of methods in accordance with various embodiments of the present invention.

FIG. 18 shows a flow diagram of methods in accordance with various embodiments of the present invention. In some embodiments, method 1800, or portions thereof, is performed by a scanning laser projection system. In other embodiments, method 1800 is performed by a series of circuits or an electronic system. Method 1800 is not limited by the particular type of apparatus performing the method. The various actions in method 1800 may be performed in the order presented, or may be performed in a different order. Further, in some embodiments, some actions listed in FIG. 18 are omitted from method 1800.

Method 1800 is shown beginning with block 1810. As shown at 1810, two laser beams are combined with a non-polarizing beam splitter and split into first and second light paths having different optical path lengths. The two laser beams may have any wavelength, including visible wavelengths or nonvisible wavelengths. For example, in some embodiments, the first laser beam is a red laser beam, and the second laser beam is a green laser beam. In some embodiments, the two laser beams are incident on the non-polarizing beam splitter 90 degrees apart. For example, the two laser beams may be 90 degrees apart as shown in FIGS. 2 and 6. In other embodiments, the two laser beams may be incident on the non-polarizing beam splitter at an angle other than 90 degrees. For example, the two laser beams may be other than 90 degrees apart as shown in FIGS. 11 and 12.

At 1820, a third laser beam is introduced into the first light path using a first dichroic mirror, and at 1830, a fourth laser beam is introduced into the second light path using a second dichroic mirror. The third and fourth laser beams may have any wavelength, including visible wavelengths or nonvisible wavelengths. For example, in some embodiments, the third laser beam is a blue laser beam, and the fourth laser beam is an IR laser beam.

At 1840, the first light path is passed through a polarizing rotation device. For example, in some embodiments, the first light path is passed through a half wave plate to rotate the polarization of the light beam in the first light path by 90 degrees. At 1850, the first and second light paths are recombined using a polarizing beam splitter to create a combined reduced speckle light beam.

Figure 19:
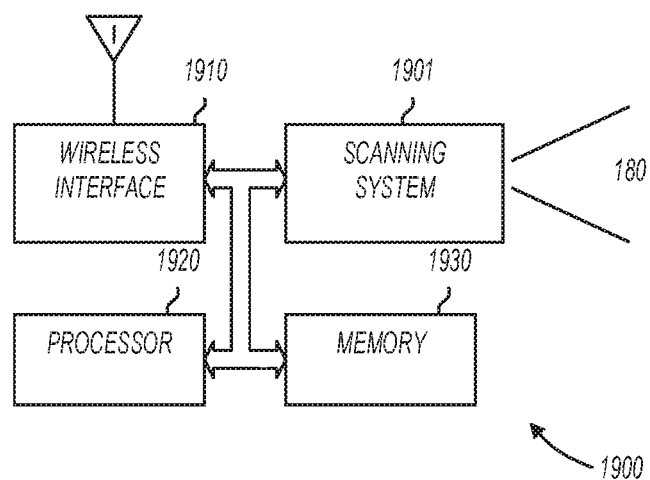
FIG. 19 shows a block diagram of a mobile device in accordance with various embodiments of the present invention.

FIG. 19 shows a block diagram of a mobile device in accordance with various embodiments of the present invention. As shown in FIG. 19, mobile device 1900 includes wireless interface 1910, processor 1920, memory 1930, and scanning system 1901. Scanning system 1901 includes any of the beam combining optics with speckle reduction as described above.

Scanning system 1901 may receive image data from any image source. For example, in some embodiments, scanning system 1901 includes memory that holds still images. In other embodiments, scanning system 1901 includes memory that includes video images. In still further embodiments, scanning system 1901 displays imagery received from external sources such as connectors, wireless interface 1910, a wired interface, or the like.

Wireless interface 1910 may include any wireless transmission and/or reception capabilities. For example, in some embodiments, wireless interface 1910 includes a network interface card (NIC) capable of communicating over a wireless network. Also for example, in some embodiments, wireless interface 1910 may include cellular telephone capabilities. In still further embodiments, wireless interface 1910 may include a global positioning system (GPS) receiver. One skilled in the art will understand that wireless interface 1910 may include any type of wireless communications capability without departing from the scope of the present invention.

Processor 1920 may be any type of processor capable of communicating with the various components in mobile device 1900. For example, processor 1920 may be an embedded processor available from application specific integrated circuit (ASIC) vendors, or may be a commercially available microprocessor. In some embodiments, processor 1920 provides image or video data to scanning system 1901. The image or video data may be retrieved from wireless interface 1910 or may be derived from data retrieved from wireless interface 1910. For example, through processor 1920, scanning system 1901 may display images or video received directly from wireless interface 1910. Also for example, processor 1920 may provide overlays to add to images and/or video received from wireless interface 1910, or may alter stored imagery based on data received from wireless interface 1910 (e.g., modifying a map display in GPS embodiments in which wireless interface 1910 provides location coordinates).

Figure 20:
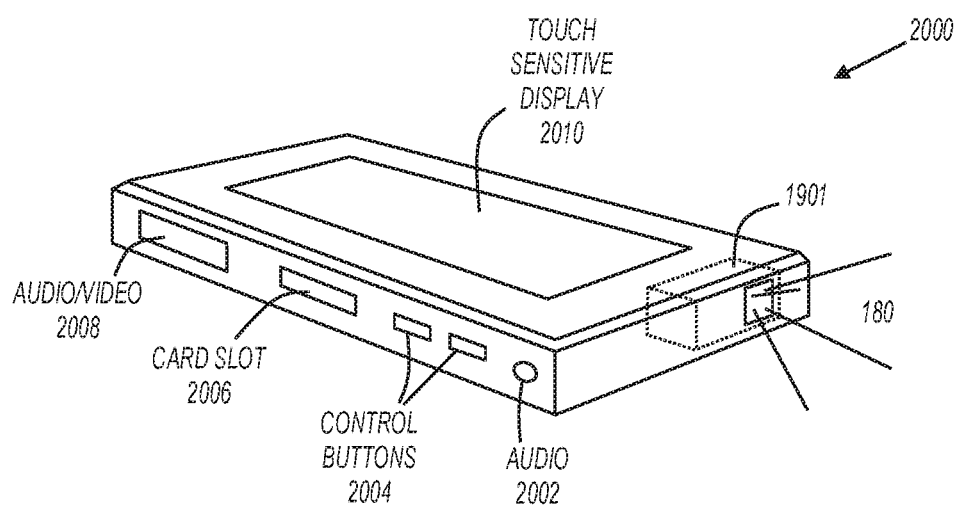
FIG. 20 shows a mobile device in accordance with various embodiments of the present invention.

FIG. 20 shows a mobile device in accordance with various embodiments of the present invention. Mobile device 2000 may be a hand held scanning laser projection system with or without communications ability. For example, in some embodiments, mobile device 2000 may be a scanning laser projection system with little or no other capabilities. Also for example, in some embodiments, mobile device 2000 may be a device usable for communications, including for example, a cellular phone, a smart phone, a tablet computing device, a global positioning system (GPS) receiver, or the like. Further, mobile device 2000 may be connected to a larger network via a wireless (e.g., cellular), or this device can accept and/or transmit data messages or video content via an unregulated spectrum (e.g., WiFi) connection.

Mobile device 2000 includes scanning system 1901, touch sensitive display 2010, audio port 2002, control buttons 2004, card slot 2006, and audio/video (A/V) port 2008. None of these elements are essential. For example, mobile device 2000 may only include scanning system 1901 without any of touch sensitive display 2010, audio port 2002, control buttons 2004, card slot 2006, or A/V port 2008. Some embodiments include a subset of these elements. For example, an accessory projector may include scanning system 1901, control buttons 2004 and A/V port 2008. A smartphone embodiment may combine touch sensitive display device 2010 and scanning system 1901.

Touch sensitive display 2010 may be any type of display. For example, in some embodiments, touch sensitive display 2010 includes a liquid crystal display (LCD) screen. In some embodiments, display 2010 is not touch sensitive. Display 2010 may or may not always display the image projected by scanning system 1901. For example, an accessory product may always display the projected image on display 2010, whereas a mobile phone embodiment may project a video while displaying different content on display 2010. Some embodiments may include a keypad in addition to touch sensitive display 2010.

A/V port 2008 accepts and/or transmits video and/or audio signals. For example, A/V port 2008 may be a digital port, such as a high definition multimedia interface (HDMI) interface that accepts a cable suitable to carry digital audio and video data. Further, A/V port 2008 may include RCA jacks to accept or transmit composite inputs. Still further, A/V port 2008 may include a VGA connector to accept or transmit analog video signals. In some embodiments, mobile device 2000 may be tethered to an external signal source through A/V port 2008, and mobile device 2000 may project content accepted through A/V port 2008. In other embodiments, mobile device 2000 may be an originator of content, and A/V port 2008 is used to transmit content to a different device.

Audio port 2002 provides audio signals. For example, in some embodiments, mobile device 2000 is a media recorder that can record and play audio and video. In these embodiments, the video may be projected by scanning system 1901 and the audio may be output at audio port 2002.

Mobile device 2000 also includes card slot 2006. In some embodiments, a memory card inserted in card slot 2006 may provide a source for audio to be output at audio port 2002 and/or video data to be projected by scanning laser projector 1901. Card slot 2006 may receive any type of solid state memory device, including for example secure digital (SD) memory cards.

Figure 21:
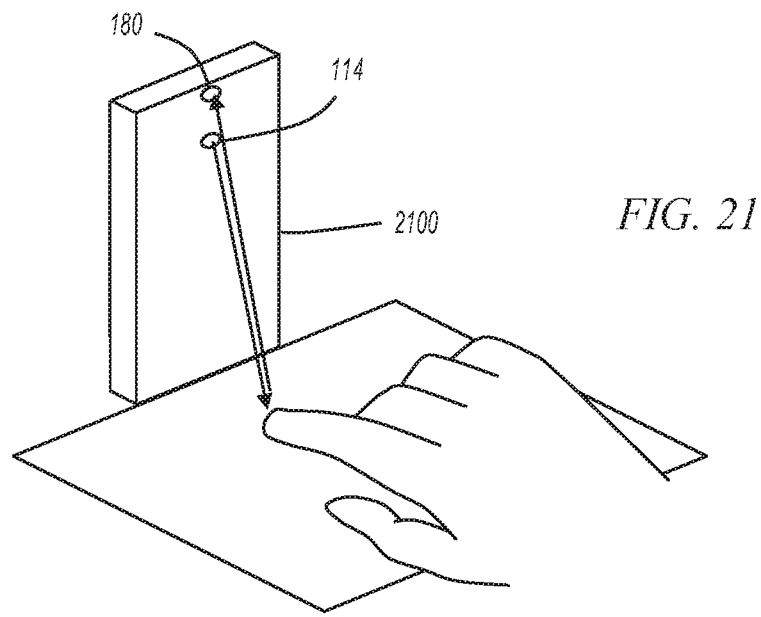
FIG. 21 shows a mobile laser detection and ranging (LIDAR) device.

FIG. 21 shows a mobile laser detection and ranging (LIDAR) device. Mobile LIDAR device 2100 includes scanning device 114 and photodetector 180, which may be part of a scanning laser projection system with ranging capabilities such as system 100 (FIG. 1). In operation, LIDAR device 2100 may emit IR laser pulses in the field of view and detect the time-of-flight of reflected pulses to determine the distance to objects in the field of view. LIDAR device 2100 may also project an image in the field of view. LIDAR device 2100 includes a beam combining optical device such as device 200 (FIG. 2) device 600 (FIG. 600).

Figure 22:
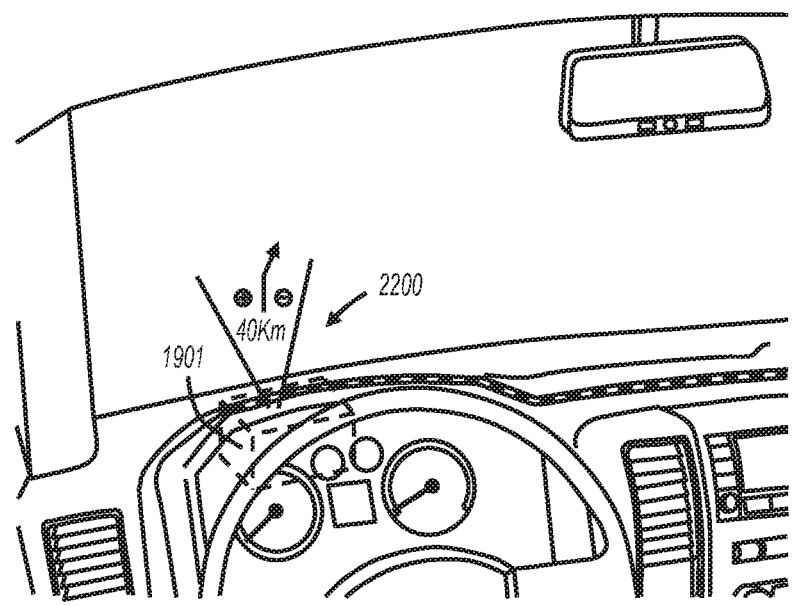
FIG. 22 shows a head-up display system in accordance with various embodiments of the present invention.

FIG. 22 shows a head-up display system in accordance with various embodiments of the invention. Scanning system 1901 is shown as a projector mounted in a vehicle dash to project the head-up display at 2200. Although an automotive head-up display is shown in FIG. 22, this is not a limitation of the present invention. For example, various embodiments of the invention include head-up displays in avionics application, air traffic control applications, and other applications.

FIG. 23 shows eyewear in accordance with various embodiments of the invention. Scanning system 1901 is shown as a projector mounted in eyewear 2300 to project a display in the eyewear's field of view. In some embodiments, eyewear 2300 is see-through and in other embodiments, eyewear 2300 is opaque. For example, eyewear 2300 may be used in an augmented reality application in which a wearer can see the display from scanning system 1901 overlaid on the physical world. Also for example, eyewear 2300 may be used in a virtual reality application, in which a wearer's entire view is generated by scanning system 1901. Although only one scanning system 1901 is shown in FIG. 23, this is not a limitation of the present invention. For example, in some embodiments, eyewear 2300 includes two projectors; one for each eye.

FIG. 24 shows a gaming apparatus in accordance with various embodiments of the present invention. Gaming apparatus 2400 includes buttons 2402, display 2410, and scanning system 1901. In some embodiments, gaming apparatus 2400 is a standalone apparatus that does not need a larger console for a user to play a game. For example, a user may play a game while watching display 2410 and/or the projected content at 180. In other embodiments, gaming apparatus 2400 operates as a controller for a larger gaming console. In these embodiments, a user may watch a larger screen tethered to the console in combination with watching display 2410 and/or projected content at 180.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
   a non-polarizing beam splitter positioned to receive first and second laser beams and produce a first combined laser beam in a first light path and a second combined laser beam in a second light path;
   a polarization rotation device in the first light path to rotate a polarization of the first combined laser beam; and
   a polarizing beam splitter positioned to receive and combine the first combined laser beam after the polarization rotation device and the second combined laser beam to create a combined output beam;
   wherein the first light path and the second light path have different optical lengths to reduce speckle in the combined output beam.

2. The apparatus of claim 1 wherein the first light path and the second light path have different geometric lengths.

3. The apparatus of claim 1 wherein the different optical lengths result from varying indices of refraction in the first light path and the second light path.

4. The apparatus of claim 1 wherein at least one of the first and second laser beams comprises multiple laser beams that have been previously combined.

5. The apparatus of claim 4 where the first laser beam comprises a red laser beam and a green laser beam that have been previously combined and the second laser beam comprises a red laser beam and a green laser beam that have been previously combined.

6. The apparatus of claim 1 further comprising a dichroic mirror positioned to combine a third laser beam with the first combined laser beam in the first light path.

7. The apparatus of claim 6 wherein the first laser beam is a red laser beam, the second laser beam is a green laser beam, and the third laser beam is a blue laser beam.

8. The apparatus of claim 6 further comprising a second dichroic mirror positioned to combine a fourth laser beam with the second combined laser beam in the second light path.

9. The apparatus of claim 8 wherein the first laser beam is a red laser beam, the second laser beam is a green laser beam, the third laser beam is a blue laser beam, and the fourth laser beam is an infrared laser beam.

10. The apparatus of claim 8 wherein at least one of the first and second laser beams comprises multiple laser beams that have been previously combined.

11. The apparatus of claim 6 wherein the non-polarizing beam splitter, the polarizing beam splitter, the polarization rotation device and the dichroic mirror are cemented together.

12. A scanning engine comprising:
    a carrier assembly;
    at least two laser diodes affixed to the carrier assembly to create laser light beams having different wavelengths;
    a laser beam combining optic affixed to the carrier assembly, the laser beam combining optic including a non-polarizing beam splitter to combine the laser light beams having different wavelengths and split a resulting combined beam into two light paths having different optical lengths, a polarization rotation device in one of the two light paths, and a polarizing beam splitter to recombine light from the two light paths to create an output beam with reduced speckle; and
    a scanning device to receive the output beam from the laser beam combining optic and scan in two dimensions in a field of view.

13. The scanning engine of claim 12 wherein the scanning device comprises a single biaxial scanning mirror.

14. The scanning engine of claim 12 wherein the scanning device comprises a first scanning mirror configured to scan at a resonant mode in a fast scan direction, and a second scanning mirror configured to scan quasi-statically in a slow-scan direction substantially orthogonal to the fast scan direction.

15. The scanning engine of claim 12 wherein the different optical lengths result from different geometric lengths.

16. The scanning engine of claim 12 wherein the different optical lengths result from varying indices of refraction in the two light paths.

17. The apparatus of claim 12 further comprising a dichroic mirror positioned to combine a third laser beam in one of the two light paths.

18. The apparatus of claim 17 wherein the non-polarizing beam splitter, the polarizing beam splitter, the polarization rotation device and the dichroic mirror are cemented together.

19. A method comprising:
    receiving two laser beams of different wavelengths at opposite sides of a non-polarizing beam splitter to create a combined laser beam that is split in two light paths having different optical lengths;
    passing the combined laser beam in one of the two light paths through a polarization rotation device; and
    recombining light beams in the two light paths using a polarizing beam splitter to create a reduced speckle combined laser beam.

20. The method of claim 19 further comprising combining a third laser beam in one of the two light paths with a first dichroic mirror.

21. The method of claim 20 further comprising combining a fourth laser beam in one of the two light paths with a second dichroic mirror.

22. The apparatus of claim 19 wherein each of the two laser beams comprises multiple laser beams that have been previously combined.

23. The method of claim 19 further comprising scanning the reduced speckle combined laser beam in two dimensions in a field of view.

* * * * *